US012620436B2

(12) United States Patent
Ghosh et al.

(10) Patent No.: US 12,620,436 B2
(45) Date of Patent: May 5, 2026

(54) MULTI-PORTED MEMORY ARRAY UTILIZING BITCELLS WITH BALANCED P-N DIFFUSION LAYOUTS

(71) Applicant: Intel Corporation, Santa Clara, CA (US)

(72) Inventors: Amlan Ghosh, Mebane, NC (US); John R. Riley, Sebastian, FL (US); Feroze Merchant, Austin, TX (US); Jaydeep Kulkarni, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/852,569

(22) Filed: Jun. 29, 2022

(65) Prior Publication Data

US 2024/0005982 A1    Jan. 4, 2024

(51) Int. Cl.
    *G11C 8/16* (2006.01)
    *G11C 11/412* (2006.01)
    *G11C 11/419* (2006.01)
    *H10B 10/00* (2023.01)

(52) U.S. Cl.
    CPC .......... *G11C 11/412* (2013.01); *G11C 11/419* (2013.01); *H10B 10/12* (2023.02); *H10B 10/18* (2023.02)

(58) Field of Classification Search
    CPC ........................... G11C 11/412; G11C 11/419
    See application file for complete search history.

(56) References Cited

U.S. PATENT DOCUMENTS

| | | | | |
|---|---|---|---|---|
| 8,710,592 B2 * | 4/2014 | Lim | .................. | H10B 10/12 |
| | | | | 257/E27.098 |
| 8,913,455 B1 * | 12/2014 | Camarota | .............. | H10B 10/12 |
| | | | | 365/189.04 |
| 11,170,844 B1 | 11/2021 | Doluca et al. | | |
| 2008/0165562 A1 * | 7/2008 | Matick | .................. | G11C 11/412 |
| | | | | 365/72 |
| 2010/0103725 A1 * | 4/2010 | Kim | .................. | G11C 13/0026 |
| | | | | 365/205 |
| 2013/0322161 A1 * | 12/2013 | Noguchi | ............. | G11C 11/1659 |
| | | | | 365/158 |

* cited by examiner

*Primary Examiner* — Min Huang
(74) *Attorney, Agent, or Firm* — Schwegman Lundberg & Woessner, P.A.

(57) ABSTRACT

A memory device includes at least one bitcell coupled to a local bitline. The at least one bitcell includes first, second, and third sets of a plurality of transistor devices. The first set is configured to form at least one write port. The at least one write port receives digital data. The second set of the plurality of transistor devices is configured as an inverter pair that stores the digital data. The third set of the plurality of transistor devices is configured to form at least one read port. The at least one read port is used to access the digital data from the inverter pair and output the digital data on the local bitline. The plurality of transistor devices consists of an equal number of P-channel transistor devices and N-channel transistor devices.

20 Claims, 12 Drawing Sheets

100

INTERFACE CARD
(E.G. WLAN/BT CARD)　102

MEMORY DEVICE　116

FRONT END MODULE (FEM) CIRCUITRY WLAN　104A

104

SWITCH　103

FRONT END MODULE (FEM) CIRCUITRY BT　104B

RADIO IC CIRCUITRY WLAN　106A

106

RADIO IC CIRCUITRY BT　106B

WLAN-BT CO-EXISTENCE CIRCUITRY　114

WLAN BBAND PROC. CIRCUITRY　108A

108

BT BASEBAND PROCESSING CIRCUITRY　108B

112

APPLICATION PROCESSOR　111

101

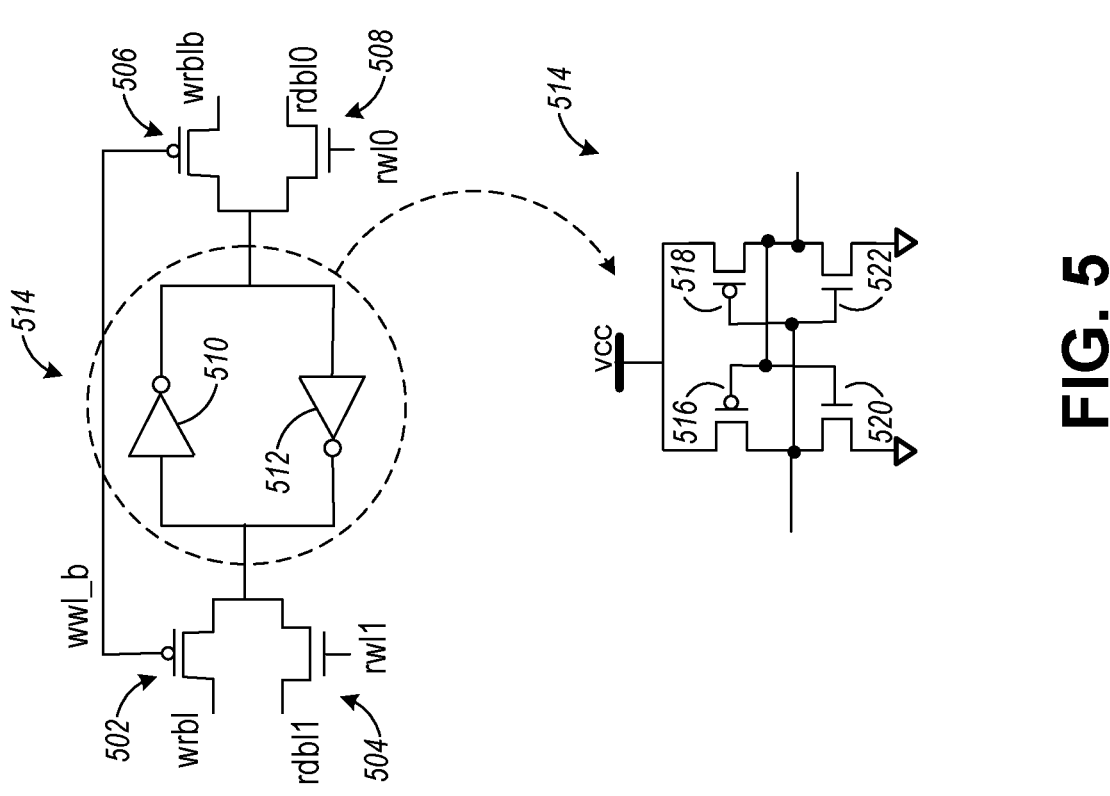
FIG. 5

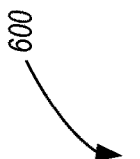
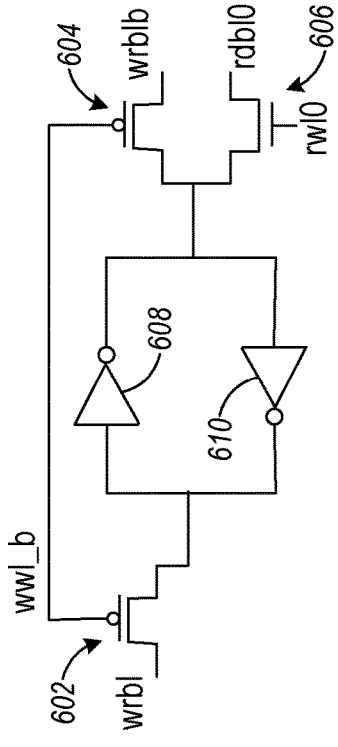
FIG. 6

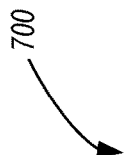
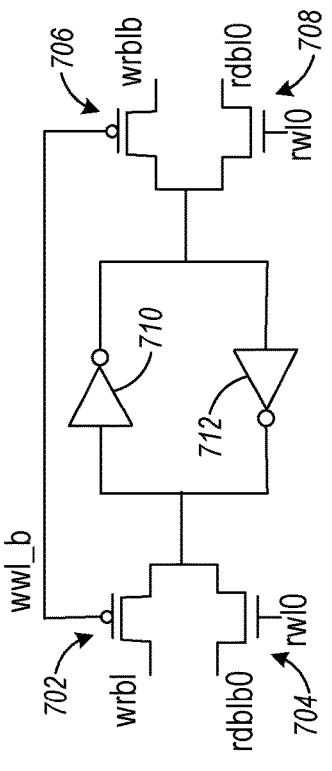
FIG. 7

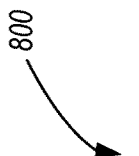
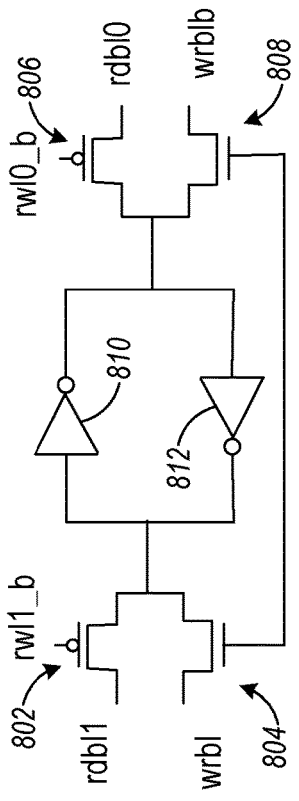
FIG. 8

1000

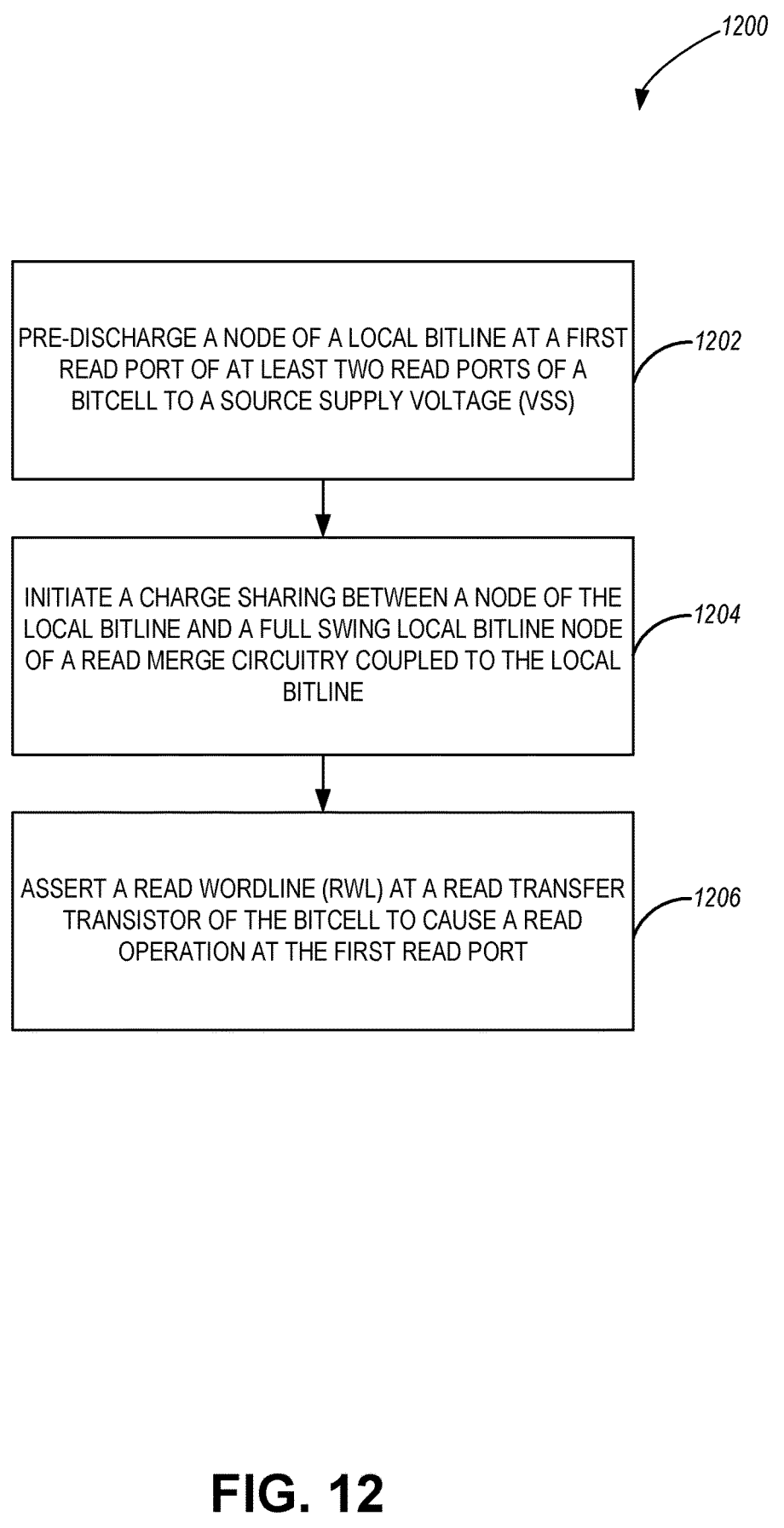

*1200*

PRE-DISCHARGE A NODE OF A LOCAL BITLINE AT A FIRST READ PORT OF AT LEAST TWO READ PORTS OF A BITCELL TO A SOURCE SUPPLY VOLTAGE (VSS) — *1202*

INITIATE A CHARGE SHARING BETWEEN A NODE OF THE LOCAL BITLINE AND A FULL SWING LOCAL BITLINE NODE OF A READ MERGE CIRCUITRY COUPLED TO THE LOCAL BITLINE — *1204*

ASSERT A READ WORDLINE (RWL) AT A READ TRANSFER TRANSISTOR OF THE BITCELL TO CAUSE A READ OPERATION AT THE FIRST READ PORT — *1206*

FIG. 12

MULTI-PORTED MEMORY ARRAY UTILIZING BITCELLS WITH BALANCED P-N DIFFUSION LAYOUTS

TECHNICAL FIELD

Embodiments pertain to improvements in memory architectures, including techniques for high-density multi-ported low-swing memory arrays utilizing one or more bitcells (e.g., one or more eight-transistor (8T) bitcells) having balanced, fully populated P-N type semiconductor diffusion layouts.

BACKGROUND

With the increased use of memory devices, further performance improvements in processing efficiency and implementation footprint are relevant considerations. Conventional memory arrays are typically associated with layout transition region spacing and reduced utilization of the available diffusion space, which increases the implementation footprint and reduces area efficiency.

BRIEF DESCRIPTION OF THE DRAWINGS

In the drawings, like numerals may describe the same or similar components or features in different views. Like numerals having different letter suffixes may represent different instances of similar components. Some embodiments are illustrated by way of example, and not limitation, in the figures of the accompanying drawings in which:

FIG. 5 illustrates a balanced P-N 8T bitcell configured as a two-read-ports-one-write-port (2R1 W) bitcell with PMOS transistors used at the write terminals, in accordance with some embodiments;

FIG. 6 illustrates a balanced P-N 8T bitcell configured as a 1R1 W bitcell with a single-ended read, in accordance with some embodiments;

FIG. 7 illustrates a balanced P-N 8T bitcell configured as a 1R1 W bitcell with a differential read, in accordance with some embodiments;

FIG. 8 illustrates a balanced P-N 8T bitcell configured as a 2R1 W bitcell with NMOS transistors used at the write terminals, in accordance with some embodiments;

FIG. 12 illustrates a flow diagram of a method for performing a memory access operation, in accordance with some embodiments.

DETAILED DESCRIPTION

Figure 1:
FIG. 1 is a block diagram of a radio architecture including an interface card with a memory device configured according to disclosed techniques, in accordance with some embodiments.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc., to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

The following description and the drawings sufficiently illustrate specific embodiments to enable those skilled in the art to practice them. Other embodiments may incorporate structural, logical, electrical, process, and other changes. Portions and features of some embodiments may be included in or substituted for, those of other embodiments. Embodiments outlined in the claims encompass all available equivalents of those claims.

The disclosed techniques can be used to configure memory devices to address the following technical deficiencies of existing memory device technologies: (a) Bitcell area: utilize 100% of the available diffusion space for active transistors to minimize the bitcell area; (b) Scalability: develop a scalable bitcell topology with an equal number of P/N which can effectively leverage future Complementary FET (CFET) technology (with P device implemented on top of an NFET or vice versa) for aggressive area scaling; (c) Array efficiency: eliminate the transition region layout spacing typically used between the peripheral standard logic cells and custom 8T 1R1 W Static Random Access Memory (SRAM) bitcell having non-standard cell height layout; and (d) Functionality: enabling multi-port functionality in a small footprint.

In some aspects, memory device technologies enable multi-port bitcell functionality by increasing the clock frequency by 2× by using a one-read-one-write (1R1 W) bitcell at the expense of increased read power, use a larger area bitcell with domino-read decoupled 2R1 W bitcell, and insert transition region area between the standard cells and the custom 8T SRAM layout regions. However, such memory device technologies may be associated with the following drawbacks: (a) Significant area overhead with transition regions between the custom 8T SRAM bitcell and the standard logic cell height; (b) Area scaling limited in modern/future CMOS technologies due to unbalanced use of P and N type transistors; and (c) Increased area overhead for baseline domino-read bitcell in future CFET technologies due to N-dominated bitcell.

The disclosed techniques can be used to configure memory devices that overcome the above drawbacks by utilize all the active diffusion space based on the following configurations: (a) employing balanced/equal-sized PMOS and NMOS transistors; (b) eliminating the transition regions between the bitcell and peripheral logic circuits by using standard cell design rules for the bitcell layout as well; (c) bitcell stability is achieved with the help of low-swing charge sharing and single-sided sensing technique; (d) multi-port 2R1 W bitcell is implemented using a balanced 8T bitcell instead of ten-transistor (10T) bitcell having two dedicated read port stacks; (e) approximately 40% bitcell smaller area than the conventional domino-read 2R1 W bitcell; (f) read merge circuit enabling intrinsic charge sharing operation using an NMOS clipper device improving the read performance; (g) noise robustness improvement with bitcell actively driving the bitline; and (h) trading-off with keeper stack strength reduction to improve the performance for read-0 operations. The above techniques can be associated with the following advantages over existing memory devices: (a) 33-41% bitcell area reduction for the 2R1 W port mode in current process technology; (b) disclosed techniques are amenable to future transistor geometry (e.g., CFET technologies) scaling, enabling bitcell area shrink and improved Mb/mm2 metric; (c) elimination of transition region space required to pitch match the custom 8T domino bitcell layout with the peripheral standard cell layout; and (d) high-performance operation with low-swing, single-ended, multi-port read operations.

FIG. 1 is a block diagram of a radio architecture 100 including an interface card 102 with a memory device 116, in accordance with some embodiments. The radio architecture 100 may be implemented in a computing device (e.g., device 1300 in FIG. 13) including user equipment (UE), a base station (e.g., a next generation Node-B (gNB), enhanced Node-B (eNB)), a smartphone, a personal computer (PC), a laptop, a tablet, or another type of wired or wireless device. The radio architecture 100 may include radio front-end module (FEM) circuitry 104, radio integrated circuit (IC) circuitry 106, memory device 116, and baseband processing circuitry 108 configured as part of the interface card 102. In this regard, radio architecture 100 (as shown in FIG. 1) includes an interface card 102 configured to perform both Wireless Local Area Network (WLAN) functionalities and Bluetooth (BT) functionalities (e.g., as WLAN/BT interface or modem card), although embodiments are not so limited and the disclosed techniques apply to other types of radio architectures with different types of interface cards as well. In this disclosure, "WLAN" and "Wi-Fi" are used interchangeably. Other example types of interface cards which can be used in connection with the disclosed techniques include graphics cards, network cards, SSD cards (such as M.2-based cards), CEM-based cards, etc.

FEM circuitry 104 may include a WLAN or Wi-Fi FEM circuitry 104A and a Bluetooth (BT) FEM circuitry 104B. The WLAN FEM circuitry 104A may include a receive signal path comprising circuitry configured to operate on WLAN RF signals received from one or more antennas 101, to amplify the received signals, and provide the amplified versions of the received signals to the WLAN radio IC circuitry 106A for further processing. The BT FEM circuitry 104B may include a receive signal path which may include circuitry configured to operate on BT RF signals received from the one or more antennas 101, to amplify the received signals, and provide the amplified versions of the received signals to the BT radio IC circuitry 106B for further processing. The WLAN FEM circuitry 104A may also include a transmit signal path which may include circuitry configured to amplify WLAN signals provided by the radio IC circuitry 106A for wireless transmission by the one or more antennas 101. Besides, the BT FEM circuitry 104B may also include a transmit signal path which may include circuitry configured to amplify BT signals provided by the radio IC circuitry 106B for wireless transmission by the one or more antennas. In the embodiment of FIG. 1, although WLAN FEM circuitry 104A and BT FEM circuitry 104B are shown as being distinct from one another, embodiments are not so limited and include within their scope the use of a FEM (not shown) that includes a transmit path and/or a receive path for both WLAN and BT signals, or the use of one or more FEM circuitries where at least some of the FEM circuitries share transmit and/or receive signal paths for both WLAN and BT signals.

Radio IC circuitry 106 as shown may include WLAN radio IC circuitry 106A and BT radio IC circuitry 106B. The WLAN radio IC circuitry 106A may include a receive signal path which may include circuitry to down-convert WLAN RF signals received from the WLAN FEM circuitry 104A and provide baseband signals to WLAN baseband processing circuitry 108A. The BT radio IC circuitry 106B may, in turn, include a receive signal path which may include circuitry to down-convert BT RF signals received from the BT FEM circuitry 104B and provide baseband signals to BT baseband processing circuitry 108B. The WLAN radio IC circuitry 106A may also include a transmit signal path which may include circuitry to up-convert WLAN baseband signals provided by the WLAN baseband processing circuitry 108A and provide WLAN RF output signals to the WLAN FEM circuitry 104A for subsequent wireless transmission by the one or more antennas 101. The BT radio IC circuitry 106B may also include a transmit signal path which may include circuitry to up-convert BT baseband signals provided by the BT baseband processing circuitry 108B and provide BT RF output signals to the BT FEM circuitry 104B for subsequent wireless transmission by the one or more antennas 101. In the embodiment of FIG. 1, although radio IC circuitries 106A and 106B are shown as being distinct from one another, embodiments are not so limited and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

Baseband processing circuitry 108 may include a WLAN baseband processing circuitry 108A and a BT baseband processing circuitry 108B. The WLAN baseband processing circuitry 108A may include a memory, such as, for example, a set of RAM arrays in a Fast Fourier Transform (FFT) or Inverse Fast Fourier Transform (IFFT) block (not shown) of the WLAN baseband processing circuitry 108A. Each of the WLAN baseband processing circuitry 108A and the BT baseband processing circuitry 108B may further include one or more processors and control logic to process the signals received from the corresponding WLAN or BT receive signal path of the radio IC circuitry 106, and to also generate corresponding WLAN or BT baseband signals for the transmit signal path of the radio IC circuitry 106. Each of the baseband processing circuitries 108A and 108B may further include a physical layer (PHY) and medium access control layer (MAC) circuitry and may further interface with a host processor (e.g., the application processor 111) in a host system (e.g., a host SoC) for generation and processing of the baseband signals and for controlling operations of the radio IC circuitry 106 (including controlling the operation of the memory device 116).

Referring still to FIG. 1, according to the shown embodiment, WLAN-BT coexistence circuitry 114 may include logic providing an interface between the WLAN baseband processing circuitry 108A and the BT baseband processing circuitry 108B to enable use cases requiring WLAN and BT coexistence. In addition, a switch 103 may be provided between the WLAN FEM circuitry 104A and the BT FEM circuitry 104B to allow switching between the WLAN and BT radios according to application needs. In addition, although the one or more antennas 101 are depicted as being respectively connected to the WLAN FEM circuitry 104A and the BT FEM circuitry 104B, embodiments include within their scope the sharing of the one or more antennas 101 as between the WLAN and BT FEMs, or the provision of more than one antenna connected to each of FEM circuitries 104A or 104B.

In some embodiments, the front-end module circuitry 104, the radio IC circuitry 106, and the baseband processing circuitry 108 may be provided on a single radio card, such as the interface card 102. In some other embodiments, the one or more antennas 101, the FEM circuitry 104, and the radio IC circuitry 106 may be provided on a single radio card. In some other embodiments, the radio IC circuitry 106 and the baseband processing circuitry 108 may be provided on a single chip or IC, such as IC 112.

In some embodiments, the interface card 102 can be configured as a wireless radio card, such as a WLAN radio card configured for wireless communications (e.g., WiGig communications in the 60 GHz range or mmW communications in the 24.24 GHz-52.6 GHz range), although the scope of the embodiments is not limited in this respect. In some of these embodiments, the radio architecture 100 may be configured to receive and transmit orthogonal frequency division multiplexed (OFDM) or orthogonal frequency division multiple access (OFDMA) communication signals over a multicarrier communication channel. The OFDM or OFDMA signals may comprise a plurality of orthogonal subcarriers.

In some embodiments, the interface card 102 may include one or more memory devices such as memory device 116. Memory device 116 can be configured based on the disclosed techniques. In this regard, memory device 116 can be the same as, or include, one or more of the memory devices discussed in connection with FIGS. 5-13.

In some of these multicarrier embodiments, radio architecture 100 may be part of a Wi-Fi communication station (STA) such as a wireless access point (AP), a base station, or a mobile device including a Wi-Fi enabled device. In some of these embodiments, radio architecture 100 may be configured to transmit and receive signals in accordance with specific communication standards and/or protocols, such as any of the Institute of Electrical and Electronics Engineers (IEEE) standards including, 802.11n-2009, IEEE 802.11-2012, 802.11n-2009, 802.11ac, IEEE 802.11-2016, 802.11ad, and/or 802.11ax standards and/or proposed specifications for WLANs, although the scope of embodiments is not limited in this respect and operations using other wireless standards can also be configured. Radio architecture 100 may also be suitable to transmit and/or receive communications in accordance with other techniques and standards, including a 3rd Generation Partnership Project (3GPP) standard, including a communication standard used in connection with 5G or new radio (NR) communications.

In some embodiments, the radio architecture 100 may be configured for high-efficiency (HE) Wi-Fi communications in accordance with the IEEE 802.11ax standard or another standard associated with wireless communications. In these embodiments, the radio architecture 100 may be configured to communicate in accordance with an OFDMA technique, although the scope of the embodiments is not limited in this respect.

In some other embodiments, the radio architecture 100 may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the embodiments is not limited in this respect.

In some embodiments, as further shown in FIG. 1, the BT baseband processing circuitry 108B may be compliant with a Bluetooth (BT) connectivity standard such as Bluetooth, Bluetooth 4.0 or Bluetooth 5.0, or any other iteration of the Bluetooth Standard. In embodiments that include BT functionality as shown for example in FIG. 1, the radio architecture 100 may be configured to establish a BT synchronous connection-oriented (SCO) link and or a BT low energy (BT LE) link. In some of the embodiments that include functionality, the radio architecture 100 may be configured to establish an extended SCO (eSCO) link for BT communications, although the scope of the embodiments is not limited in this respect. In some of these embodiments that include a BT functionality, the radio architecture may be configured to engage in a BT Asynchronous Connection-Less (ACL) communications, although the scope of the embodiments is not limited in this respect. In some embodiments, as shown in FIG. 1, the functions of a BT radio card and WLAN radio card may be combined on a single wireless radio card, such as the interface card 102, although embodiments are not so limited, and include within their scope discrete WLAN and BT radio cards In some embodiments, the radio architecture 100 may include other radio cards, such as a cellular radio card configured for cellular/wireless communications (e.g., 3GPP such as LTE, LTE-Advanced, WiGig, or 5G communications including mmW communications), which may be implemented together with (or as part of) the interface card 102.

In some IEEE 802.11 embodiments, the radio architecture 100 may be configured for communication over various channel bandwidths including bandwidths having center frequencies of about 900 MHz, 2.4 GHz, 5 GHz, and bandwidths of about 1 MHz, 2 MHz, 2.5 MHz, 4 MHz, 5 MHz, 8 MHz, 10 MHz, 16 MHz, 20 MHz, 40 MHz, 80 MHz (with contiguous bandwidths) or 80+80 MHz (160 MHz) (with non-contiguous bandwidths). In some embodiments, a 320 MHz channel bandwidth may be used. The scope of the embodiments is not limited with respect to the above center frequencies, however.

In some embodiments, memory device 116 is configured as cache memory, including array and queues used in high performance microprocessor CPU/GPU designs. Other use cases of the disclosed memory devices can be configured as well.

Figure 2:
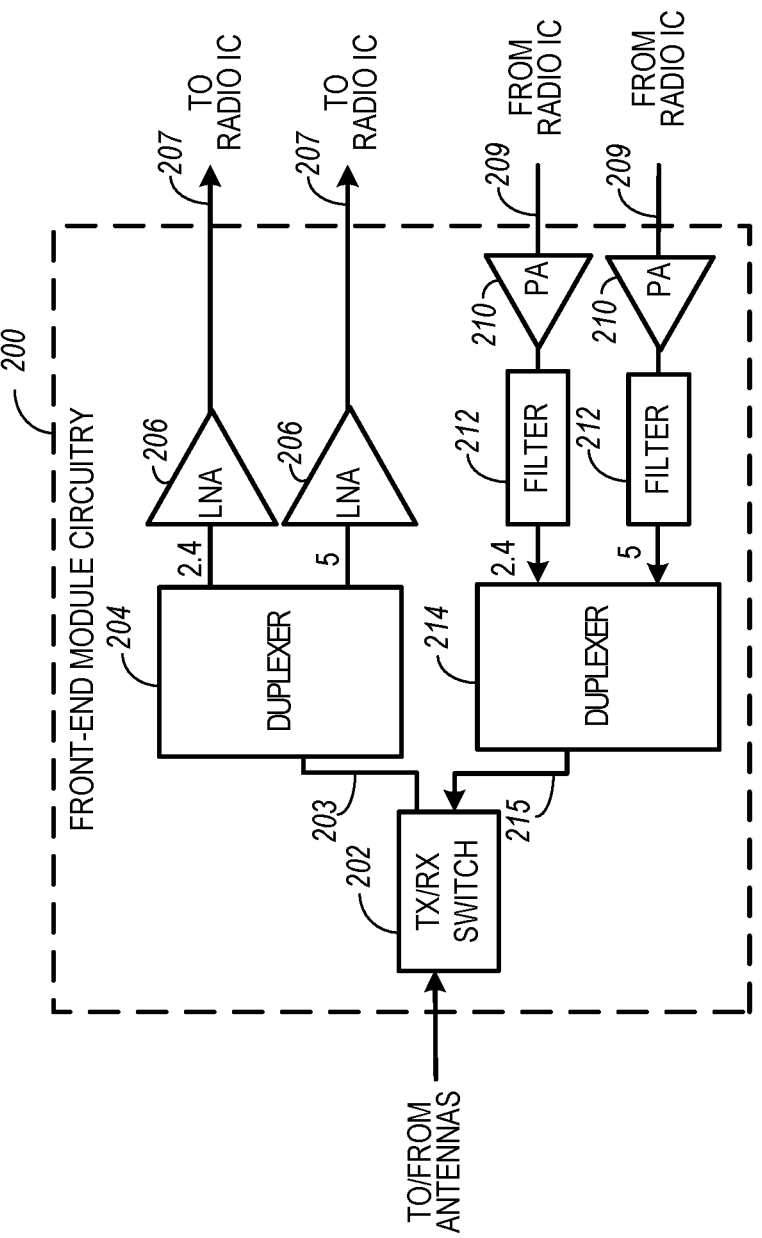
FIG. 2 illustrates a front-end module circuitry for use in the radio architecture of FIG. 1, in accordance with some embodiments.

FIG. 2 illustrates FEM circuitry 200 in accordance with some embodiments. The FEM circuitry 200 is one example of circuitry that may be suitable for use as the WLAN and/or BT FEM circuitry 104A/104B (FIG. 1), although other circuitry configurations may also be suitable.

In some embodiments, the FEM circuitry 200 may include a TX/RX switch 202 to switch between transmit (TX) mode and receive (RX) mode operation. In some aspects, a diplexer may be used in place of a TX/RX switch.

The FEM circuitry 200 may include a receive signal path and a transmit signal path. The receive signal path of the FEM circuitry 200 may include a low-noise amplifier (LNA) 206 to amplify received RF signals 203 and provide the amplified received RF signals 207 as an output (e.g., to the radio IC circuitry 106 (FIG. 1)). The transmit signal path of the FEM circuitry 200 may include a power amplifier (PA) to amplify input RF signals 209 (e.g., provided by the radio IC circuitry 106), and one or more filters 212, such as band-pass filters (BPFs), low-pass filters (LPFs) or other types of filters, to generate RF signals 215 for subsequent transmission (e.g., by the one or more antennas 101 (FIG. 1)).

In some dual-mode embodiments for Wi-Fi communication, the FEM circuitry 200 may be configured to operate in, e.g., either the 2.4 GHz frequency spectrum or the 5 GHz frequency spectrum. In these embodiments, the receive signal path of the FEM circuitry 200 may include a receive signal path duplexer 204 to separate the signals from each spectrum as well as provide a separate LNA 206 for each spectrum as shown. In these embodiments, the transmit signal path of the FEM circuitry 200 may also include a power amplifier (PA) 210 and one or more filters 212, such as a BPF, an LPF, or another type of filter for each frequency spectrum, and a transmit signal path duplexer 214 to provide the signals of one of the different spectrums onto a single transmit path for subsequent transmission by the one or more antennas 101 (FIG. 1). In some embodiments, BT communications may utilize the 2.4 GHz signal paths and may utilize the same FEM circuitry 200 as the one used for WLAN communications.

Figure 3:
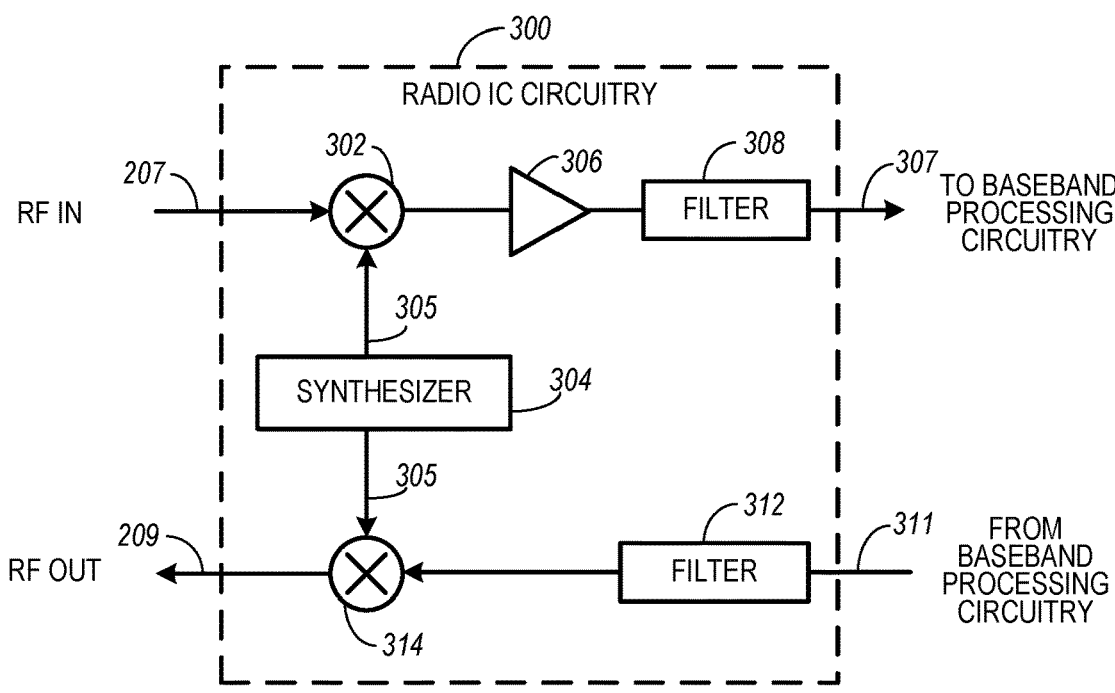
FIG. 3 illustrates a radio IC circuitry for use in the radio architecture of FIG. 1, in accordance with some embodiments.

FIG. 3 illustrates radio IC circuitry 300 in accordance with some embodiments. The radio IC circuitry 300 is one example of circuitry that may be suitable for use as the WLAN or BT radio IC circuitry 106A/106B (FIG. 1), although other circuitry configurations may also be suitable.

In some embodiments, the radio IC circuitry 300 may include a receive signal path and a transmit signal path. The receive signal path of the radio IC circuitry 300 may include mixer circuitry 302, such as, for example, down-conversion mixer circuitry, amplifier circuitry 306, and filter circuitry 308. The transmit signal path of the radio IC circuitry 300 may include at least filter circuitry 312 and mixer circuitry 314, such as up-conversion mixer circuitry. Radio IC circuitry 300 may also include synthesizer circuitry 304 for synthesizing a frequency 305 for use by the mixer circuitry 302 and the mixer circuitry 314. The mixer circuitry 302 and/or 314 may each, according to some embodiments, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 3 illustrates only a simplified version of a radio IC circuitry and may include, although not shown, embodiments where each of the depicted circuitries may include more than one component. For instance, mixer circuitry 302 and/or 314 may each include one or more mixers, and filter circuitries 308 and/or 312 may each include one or more filters, such as one or more BPFs and/or LPFs according to application needs. For example, when mixer circuitries are of the direct-conversion type, they may each include two or more mixers.

In some embodiments, mixer circuitry 302 may be configured to down-convert RF signals 207 received from the FEM circuitry 104 (FIG. 1) based on the synthesized frequency 305 provided by the synthesizer circuitry 304. The amplifier circuitry 306 may be configured to amplify the down-converted signals and the filter circuitry 308 may include an LPF configured to remove unwanted signals from the down-converted signals to generate output baseband signals 307. Output baseband signals 307 may be provided to the baseband processing circuitry 108 (FIG. 1) for further processing. In some embodiments, the output baseband signals 307 may be zero-frequency baseband signals, although this is not a requirement. In some embodiments, mixer circuitry 302 may comprise passive mixers, although the scope of the embodiments is not limited in this respect.

In some embodiments, the mixer circuitry 314 may be configured to up-convert input baseband signals 311 based on the synthesized frequency 305 provided by the synthesizer circuitry 304 to generate RF output signals 209 for the FEM circuitry 104. The baseband signals 311 may be provided by the baseband processing circuitry 108 and may be filtered by filter circuitry 312. The filter circuitry 312 may include an LPF or a BPF, although the scope of the embodiments is not limited in this respect.

In some embodiments, the mixer circuitry 302 and the mixer circuitry 314 may each include two or more mixers and may be arranged for quadrature down-conversion and/or up-conversion respectively with the help of the synthesizer circuitry 304. In some embodiments, the mixer circuitry 302 and the mixer circuitry 314 may each include two or more mixers each configured for image rejection (e.g., Hartley image rejection). In some embodiments, the mixer circuitry 302 and the mixer circuitry 314 may be arranged for direct down-conversion and/or direct up-conversion, respectively. In some embodiments, the mixer circuitry 302 and the mixer circuitry 314 may be configured for super-heterodyne operation, although this is not a requirement.

Mixer circuitry 302 may comprise, according to one embodiment: quadrature passive mixers (e.g., for the in-phase (I) and quadrature-phase (Q) paths). In such an embodiment, RF input signal 207 from FIG. 2 may be down-converted to provide I and Q baseband output signals to be sent to the baseband processor.

Quadrature passive mixers may be driven by zero and ninety-degree time-varying LO switching signals provided by a quadrature circuitry which may be configured to receive a LO frequency (fLO) from a local oscillator or a synthesizer, such as LO frequency 305 of synthesizer circuitry 304 (FIG. 3). In some embodiments, the LO frequency may be the carrier frequency, while in other embodiments, the LO frequency may be a fraction of the carrier frequency (e.g., one-half the carrier frequency, one-third the carrier frequency). In some embodiments, the zero and ninety-degree time-varying switching signals may be generated by the synthesizer, although the scope of the embodiments is not limited in this respect.

In some embodiments, the LO signals may differ in the duty cycle (the percentage of one period in which the LO signal is high) and/or offset (the difference between start points of the period). In some embodiments, the LO signals may have a 25% duty cycle and a 50% offset. In some embodiments, each branch of the mixer circuitry (e.g., the in-phase (I) and quadrature-phase (Q) path) may operate at a 25% duty cycle, which may result in a significant reduction in power consumption.

The RF input signal 207 (FIG. 2) may comprise a balanced signal, although the scope of the embodiments is not limited in this respect. The I and Q baseband output signals may be provided to the low-noise amplifier, such as amplifier circuitry 306 (FIG. 3) or to filter circuitry 308 (FIG. 3).

In some embodiments, the output baseband signals 307 and the input baseband signals 311 may be analog, although the scope of the embodiments is not limited in this respect. In some alternate embodiments, the output baseband signals 307 and the input baseband signals 311 may be digital. In these alternate embodiments, the radio IC circuitry may include an analog-to-digital converter (ADC) and digital-to-analog converter (DAC) circuitry.

In some dual-mode embodiments, a separate radio IC circuitry may be provided for processing signals for each spectrum, or for other spectrums not mentioned here, although the scope of the embodiments is not limited in this respect.

In some embodiments, the synthesizer circuitry 304 may be a fractional-N synthesizer or a fractional N/N+1 synthesizer, although the scope of the embodiments is not limited in this respect as other types of frequency synthesizers may be suitable. In some embodiments, the synthesizer circuitry 304 may be a delta-sigma synthesizer, a frequency multiplier, or a synthesizer comprising a phase-locked loop with a frequency divider. According to some embodiments, the synthesizer circuitry 304 may include a digital frequency synthesizer circuitry. An advantage of using a digital synthesizer circuitry is that, although it may still include some analog components, its footprint may be scaled down much more than the footprint of an analog synthesizer circuitry. In some embodiments, frequency input into synthesizer circuitry 304 may be provided by a voltage-controlled oscillator (VCO), although that is not a requirement. A divider control input may further be provided by either the baseband processing circuitry 108 (FIG. 1) or the host processor 111 (FIG. 1) depending on the desired output frequency 305. In some embodiments, a divider control input (e.g., N) may be determined from a look-up table (e.g., within a Wi-Fi card) based on a channel number and a channel center frequency as determined or indicated by the host processor 111.

In some embodiments, synthesizer circuitry 304 may be configured to generate a carrier frequency as the output frequency 305, while in other embodiments, the output frequency 305 may be a fraction of the carrier frequency (e.g., one-half the carrier frequency, one-third the carrier frequency). In some embodiments, the output frequency 305 may be a LO frequency (fLO).

Figure 4:
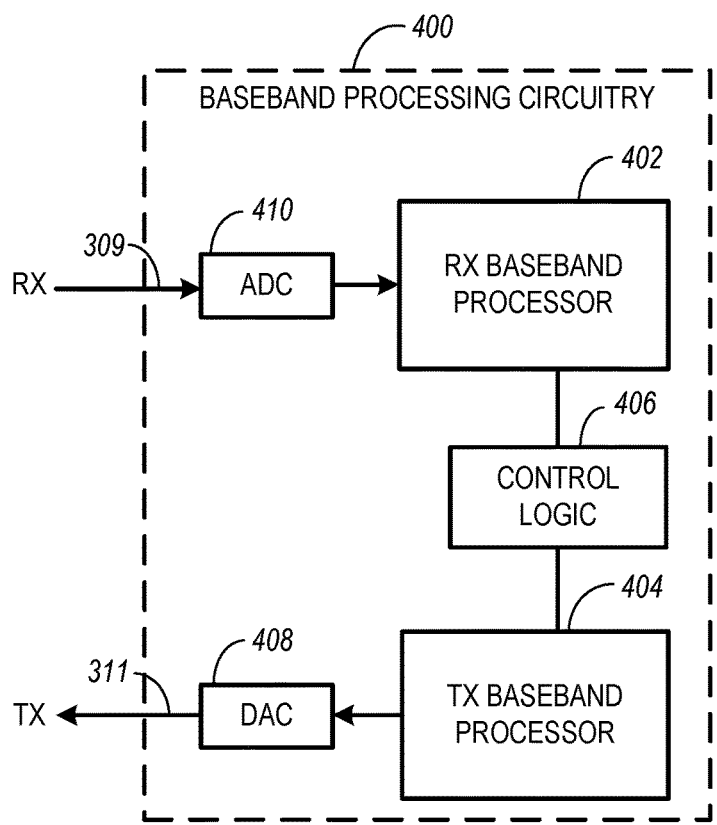
FIG. 4 illustrates a baseband processing circuitry for use in the radio architecture of FIG. 1, in accordance with some embodiments.

FIG. 4 illustrates a baseband processing circuitry 400 for use in the radio architecture of FIG. 1, in accordance with some embodiments. The baseband processing circuitry 400 is one example of circuitry that may be suitable for use as the baseband processing circuitry 108 (FIG. 1), although other circuitry configurations may also be suitable. The baseband processing circuitry 400 may include a receive baseband processor (RX BBP) 402 for processing receive baseband signals 309 provided by the radio IC circuitry 106 (FIG. 1) and a transmit baseband processor (TX BBP) 404 for generating transmit baseband signals 311 for the radio IC circuitry 106. The baseband processing circuitry 400 may also include control logic 406 for coordinating the operations of the baseband processing circuitry 400.

In some embodiments (e.g., when analog baseband signals are exchanged between the baseband processing circuitry 400 and the radio IC circuitry 106), the baseband processing circuitry 400 may include an analog-to-digital converter (ADC) 410 to convert analog baseband signals 309 received from the radio IC circuitry 106 to digital baseband signals for processing by the RX BBP 402. In these embodiments, the baseband processing circuitry 400 may also include a digital-to-analog converter (DAC) 408 to convert digital baseband signals from the TX BBP 404 to analog baseband signals 311.

In some embodiments that communicate OFDM signals or OFDMA signals, such as through the WLAN baseband processing circuitry 108A, the TX BBP 404 may be configured to generate OFDM or OFDMA signals as appropriate for transmission by performing an inverse fast Fourier transform (IFFT). The RX BBP 402 may be configured to process received OFDM signals or OFDMA signals by performing an FFT. In some embodiments, the RX BBP 402 may be configured to detect the presence of an OFDM signal or OFDMA signal by performing an autocorrelation, to detect a preamble, such as a short preamble, and performing a cross-correlation, to detect a long preamble. The preambles may be part of a predetermined frame structure for Wi-Fi communication.

Referring back to FIG. 1, in some embodiments, the one or more antennas 101 (FIG. 1) may each comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result. The one or more antennas 101 may each include a set of phased-array antennas, although embodiments are not so limited.

Although the radio architecture 100 is illustrated as having several separate functional elements, one or more of the functional elements may be combined and may be implemented by combinations of software configured elements, such as processing elements including digital signal processors (DSPs), and/or other hardware elements. For example, some elements may comprise one or more microprocessors, DSPs, field-programmable gate arrays (FPGAs), application-specific integrated circuits (ASICs), radio-frequency integrated circuits (RFICs), and combinations of various hardware and logic circuitry for performing at least the functions described herein. In some embodiments, the functional elements may refer to one or more processes operating on one or more processing elements.

In some aspects (e.g., as discussed in connection with FIGS. 5-8), the disclosed techniques include configuring multi-port, process technology scaling-friendly, balanced P/N 8T bitcells with fully utilized diffusion areas.

CPU designs can implement numerous one read (1R) port one write (1 W) port (or 1R1 W) as well as two read ports and one write port (2R1 W) memory arrays which can constitute approximately 25% of the total CPU layout area. These arrays can utilize 8T (for 1R1 W) or 10T (for 2R1 W) domino-read bitcells having dedicated read ports for improved performance and bitcell read-stability. However, conventional domino bitcell layout height may not align with the logic standard cell height and requires dedicated transition regions between every bitcell segment and its peripheral read/write circuitry. Frequently placed transition regions lead to inefficient layouts in current process technologies. This can degrade the array area efficiency (e. g., approximately 2-3% for a representative 512*88 size 2R1 W array in some processor technologies). Furthermore, conventional 8T/10T bitcells predominantly use NMOS transistors which can result in diffusion under-utilization in upcoming complementary FET (CFET) technologies (e.g., stacking NFET over PFET or vice-versa). This unbalanced transistor usage would not take full advantage of the area scaling benefits of CFET technology. The bitcell area scaling would be sub-optimal compared to the corresponding static CMOS logic having a balanced number of N and P transistors. The disclosed techniques provide alternative bitcell topologies which eliminate the need for dedicated transition regions as well as create balanced P/N bitcells that enable bitcell-area scaling at par with the remaining CMOS standard cell logic gates in the future processor and memory technologies.

FIG. 5 illustrates a balanced P-N 8T bitcell 500 configured as a 2R1 W bitcell with PMOS transistors used at the write terminals, in accordance with some embodiments. Referring to FIG. 5, bitcell 500 includes PMOS transistors (e.g., field-effect transistors, or FETs) 502 and 506 forming a single write (1 W) port, and NMOS transistors 504 and 508 forming two read (2R) ports. PMOS transistors 502 and 506 can be referred to as write transfer PMOS transistors, and NMOS transistors 504 and 508 can be referred to as read transfer NMOS transistors.

The gate terminals of PMOS transistors 502 and 506 form a write-wordline-bar (wwl_b) terminal, and the drain terminals form complementary write terminals (e.g., one terminal is true-write-bitline (wrbl) and the other terminal is complimentary-write-bitline (wrblb)). The gate terminals of NMOS transistors 504 and 508 form corresponding read-wordline terminals (rwl1 and rwl0), and the drain terminals form separate read-bitline terminals (e.g., rdbl1 and rdbl0).

The source terminals of the PMOS transistors 502 and 506 and the NMOS transistors 504 and 508 are connected to a cross-coupled inverter pair 514. As further illustrated in FIG. 5, cross-coupled inverter pair 514 (including inverters 510 and 512) can be formed by PMOS transistors 516 and 518, and NMOS transistors 520 and 522. In this regard, bitcell 500 is configured with an equal number of PMOS and NMOS transistors (e.g., 4 PMOS and 4 NMOS transistors forming a 2R1 W bitcell 500. The inverters 510 and 512 in inverter pair 514 function as storage nodes for digital/binary data.

Bitcell 500 is configured as a balanced P/N bitcell that aims at improving the area efficiency and scalability issues for multi-port memory technologies. Some key features of the disclosed balanced bitcells (e.g., bitcell 500) are as follows:

(a) Balanced N/P leading to improved area efficiency even in present CMOS process technologies.

(b) Balanced number and ISO-sized P and N device bitcell topology which is well suited for future CFET technology (e.g., stacked device technology) enabling multi-port memory area scaling at par with logic area scaling.

(c) Height, diffusion pattern, and N-well/P-well region distribution of bitcell 500 can be identical to a logic cell layout, along with complete utilization of diffusion regions (e.g., diffusion regions can be shared between the PMOS and the NMOS transistors), thus eliminating the need for transition regions between the bitcell segments and the peripheral read/write circuitry. This feature can be useful for memory arrays having a smaller number of bits/bitline incurring frequent transition regions between the bitcell and the peripheral regions.

(d) Same bitcell footprint for 1R1 W or 2R1 W bitcell enabling rapid proliferation across the memory compiler and easy porting from one logic technology to the next.

(e) Same bitcell footprint for 1R1 W bitcell using either single-ended or differential read operation.

As used herein, when a terminal is indicated as 0 or 1, it can be interpreted as 0V or higher voltage (e.g., 1V) respectively is applied to the terminal. In operation, PMOS transistors 502 and 506 are low level sensitive. When wwl_b becomes 0, the PMOS differential transistor pair 502-506 writes 1 when wrb1=1 (and wrblb=0).

During an example read operation, rwl0=1 (goes high), the read is obtained at rdbl0. Similarly, when rwl1=1, the read is obtained at rdbl1.

FIG. 6 illustrates a balanced P-N 8T bitcell configured as 1R1 W bitcell 600 with a single-ended read, in accordance with some embodiments. Referring to FIG. 6, the 1R1 W bitcell 600 is a variation of bitcell 500 (e.g., one NMOS transistor is removed as a read terminal) and includes PMOS transistors 602 and 604, NMOS transistor 606, and cross-coupled inverter pair formed by inverters 608 and 610.

FIG. 7 illustrates a balanced P-N 8T bitcell configured as 1R1 W bitcell 700 with a differential read, in accordance with some embodiments. Referring to FIG. 7, the 1R1 W bitcell 700 is a variation of bitcell 500. More specifically, bitcell 700 includes PMOS transistors 702 and 706 forming the 1 W port, as well as NMOS transistors 704 and 708 configured as differential reads and forming the 1R port. Bitcell 700 further includes inverters 710 and 712.

FIG. 8 illustrates a balanced P-N 8T bitcell configured as 2R1 W bitcell 800 with NMOS transistors used at the write terminals, in accordance with some embodiments; Referring to FIG. 8, the 2R1 W bitcell 800 is a "reverse image" variation of bitcell 500. More specifically, bitcell 800 includes NMOS transistors 804 and 808 forming a single write (1 W) port, and PMOS transistors 802 and 806 forming two read (2R) ports. The NMOS transistors 804 and 808 can be referred to as write transfer NMOS transistors, and the PMOS transistors 802 and 806 can be referred to as read transfer PMOS transistors. Bitcell 800 further includes inverters 810 and 812.

The gate terminals of NMOS transistors 804 and 808 form a write-wordline (wwl) terminal, and the drain terminals form complementary write terminals (e.g., one terminal is wrbl and the other terminal is wrblb). The gate terminals of PMOS transistors 802 and 806 form corresponding read-wordline-bar terminals (rwl1_b and rwl0_b), and the drain terminals form separate read-bitline terminals (e.g., rdbl1 and rdbl0).

In some embodiments, the disclosed techniques can be used to configure memory devices as low-swing, single-ended, compact read sensing circuits (e.g., as discussed in connection with FIGS. 9-11). In contrast to baseline domino 8T/10T bitcell, the disclosed balanced P/N 8T bitcell (e.g., as discussed in connection with FIG. 5) can be used in a coupled-read mechanism. Hence the bitcell-stability during a read operation for both 1R1 W and 2R1 W (with two simultaneous reads) modes may need to be guaranteed. The disclosed techniques include configuring a low swing, single-ended, and compact read sensing circuits as illustrated in FIG. 9.

Figure 9:
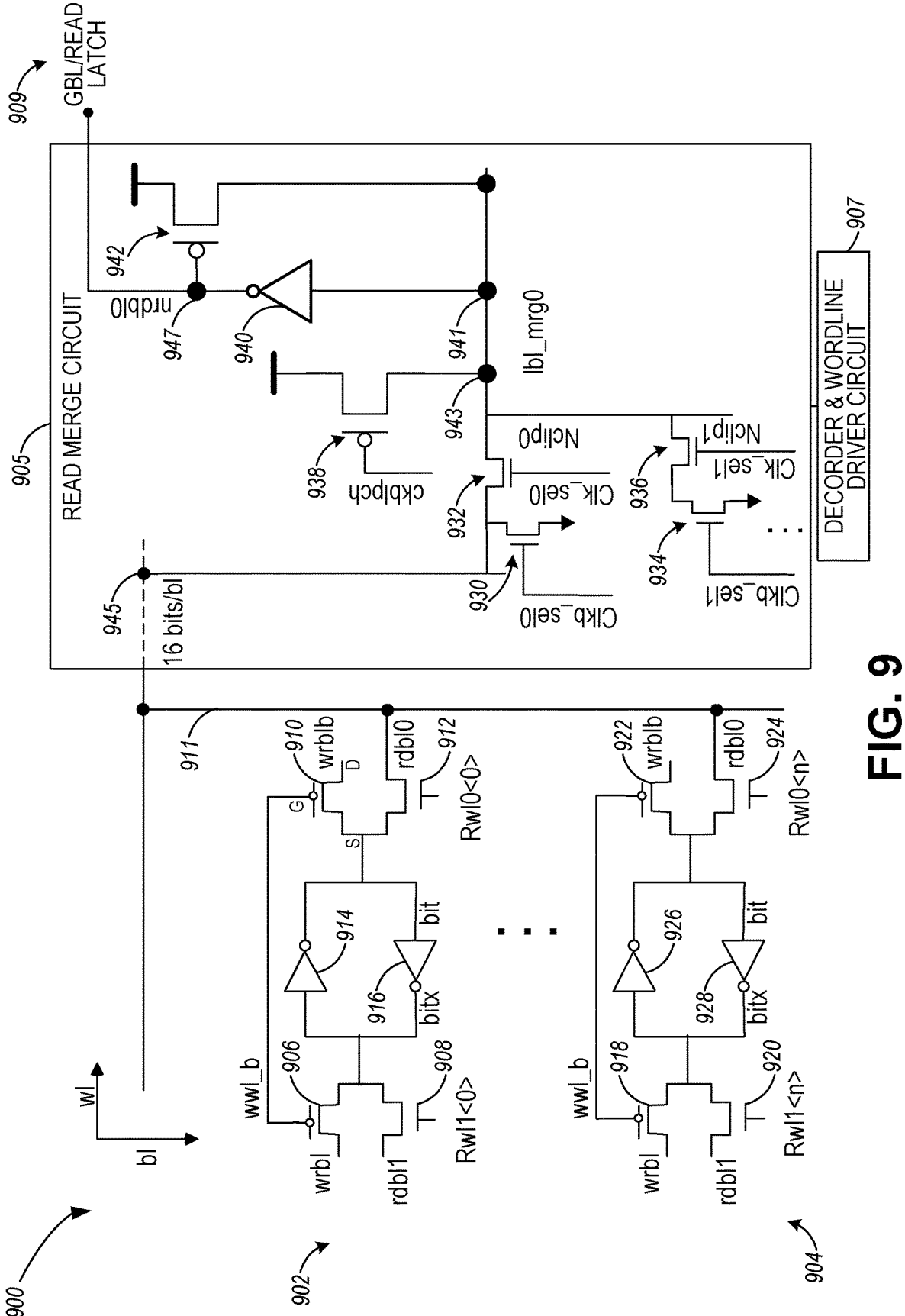
FIG. 9 illustrates a memory device configured with multiple bitcells and a read merge circuit performing a read operation, in accordance with some embodiments.

FIG. 9 illustrates a memory device 900 configured with multiple bitcells and a read merge circuit performing a read operation, in accordance with some embodiments. Referring to FIG. 9, memory device 900 includes multiple bitcells 902, . . . , 904, a read merge circuit 905, and a decoder and wordline driver circuit 907. Each of the bitcells 902, . . . , 904 can be a 2R1 W bitcell similar to bitcell 500 of FIG. 5. More specifically, bitcell 902 includes PMOS transistors 906 and 910, NMOS transistors 908 and 912, and inverters 914 and 916, all coupled in a 2R1 W configuration. Similarly, bitcell 904 includes PMOS transistors 918 and

922, NMOS transistors 920 and 924, and inverters 926 and 928, all coupled in a 2R1 W configuration.

The read merge circuit 905 includes pre-discharge devices 930, 934, . . . (e.g., NMOS transistors), and clipper devices 932, 936, . . . (e.g., NMOS transistors). Even though only two clipper devices and two pre-discharge devices are illustrated in FIG. 9, the read merge circuit 905 can include additional clipper and pre-discharge devices (e.g., two additional such devices) to accommodate multiple bitlines (e.g., four bitlines with 16 bitcells on each). Other configurations with a different number of bitcells are also possible (e.g., as illustrated in FIG. 11) and can be used in different embodiments.

Multiple balanced P/N 8T bitcells 902, . . . , 904 are connected to the local bitlines (LBLs) (e.g., connection to local bitline 911 at each of the rdlbl0 nodes of the bitcells), and four such LBLs are multiplexed together to share the peripheral read circuits enabling a compact read path design. In the coupled read design of the memory device 900 associated with multiple bitcells in a single LBL, read stability can be compromised at each bitcell as current is flowing through the inverter pair. The disclosed techniques can be used to ensure that when a read wordline is open, the data stored in each bitcell does not get corrupted.

Each of the clipper devices acts as a multiplexer, with only one clipper device (and one corresponding bitline) being ON at the same time. At any given time, 64 bits can be connected to node 945. Other number of bits can be used in different embodiments.

In an example operation, reading can be performed in two phases—a pre-charge phase and an evaluation phase.

During the pre-charge phase, rwl0 is OFF, clkb_sel0 is at 1, pre-charge signal ckblpch is at 0, and clk_sel0 is also at 0. Pre-discharge device 930 is ON, pre-charge device 938 is ON, and clipper device 932 is OFF. Node 941 is at 1, node 945 is at 0, node 947 is at 0, and the keeper device 942 is ON.

During the evaluation phase, the pre-discharge device 930 is OFF, the pre-charge device 938 turns OFF, clipper device 932 turns ON, node 945 is at 0, and node 941 is at 1, which causes a mid-rail value of around 0.5V at the clipper device 932 (assuming supply voltage is 1V). Rwl0 opens for a read, rdbl0 is discharging at 0, and the read merge circuit 905 for rdbl1 will detect charging at rdbl1 to 1 (assuming bit node of 902 cell is storing a '0' and a bitx node is storing a '1'). Internal node lb1_mrg0 discharges to 0, and in a corresponding read merge circuit (not illustrated in FIG. 9) for rdbl1, charging at rdbl1 to 1 is detected. Internal node lb1_mrg0 discharges to 0, and in the other read merge circuit, the internal node lb1_mrg1 charges to 1. A final read output is determined at node 947 (e.g., if bit node of 902 cell is at 0, the output is a 1) and is output at the read latch 909. In the complementary read merge circuit, lb1_mrg1 is at 1 and the read output is at 0.

The LBL multiplexing (e.g., 4:1 multiplexing used by the memory device 900) can be achieved using NMOS clipper transistors (e.g., Nclip0-3, also referred to as clipper devices 932, 936, . . . ) which provide a low swing LBL path. Since the stability of the bitcell becomes vulnerable due to simultaneous dual read operation, the mid-rail voltage at the local bitline before the read operation helps/ensures the bitcell stability. For improving the dynamic read stability of the balanced 8T bitcell, the local bitline 911 node (e.g., node 945) is initially pre-discharged to Vss before a read operation. The NMOS clipper device is enabled just before the read wordline (RWL) is triggered. This initiates a local charge sharing between the LBL node (e.g., nodes of rdbl0 and rdbl1) and the full swing LBL node (e.g., lb1_mrg0 at nodes 941 and 943, connected to the bitline pre-charge device 938 and the keeper device 942). The charge share operation lowers the LBL (rdbl0) voltage before RWL is asserted and improves the read-1 stability of the bitcell. At the same time, the second read port (e.g., rdbl1) experiences a read-0 scenario. In this case, the bitcell PMOS acts as a charge restoration device and charges the rdlbl1 node towards Vcc which would charge the rdlbl1 node towards Vcc-Vt (clipper NMOS in series). Once the lb1_mrg0 node crosses the keeper inverter switching threshold, the keeper PMOS is turned ON and completes a full voltage rail transition on the lb1_mrg0 case. Thus, a charge-shared mid-rail rd1b10/1 voltage facilitates read-0 as well as read-1 stability for the simultaneous dual read operation.

The write operation is performed in a similar way as the baseline domino bitcell.

In some aspects, the decoder and wordline driver circuit 907 can be configured to control the operation of the read merge circuit 905. For example, the decoder and wordline driver circuit 907 can generate the various transistor control signals used in the read merge circuit 905, such as ckblpch, clkb_sel0, and clk_sel0.

Figure 10:
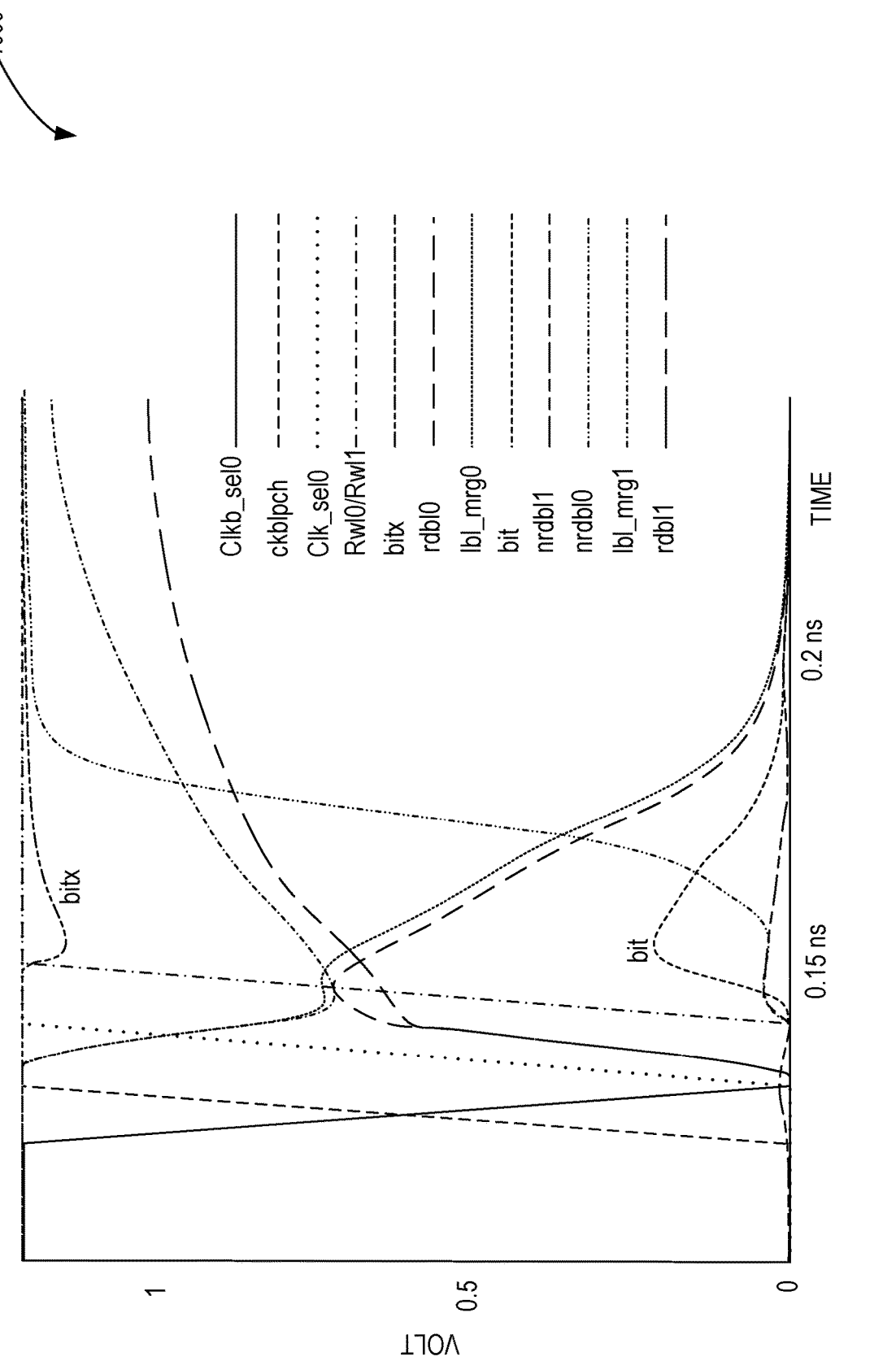
FIG. 10 illustrates a graphical representation of signals used by the memory device of FIG. 9, in accordance with some embodiments.
Figure 11:
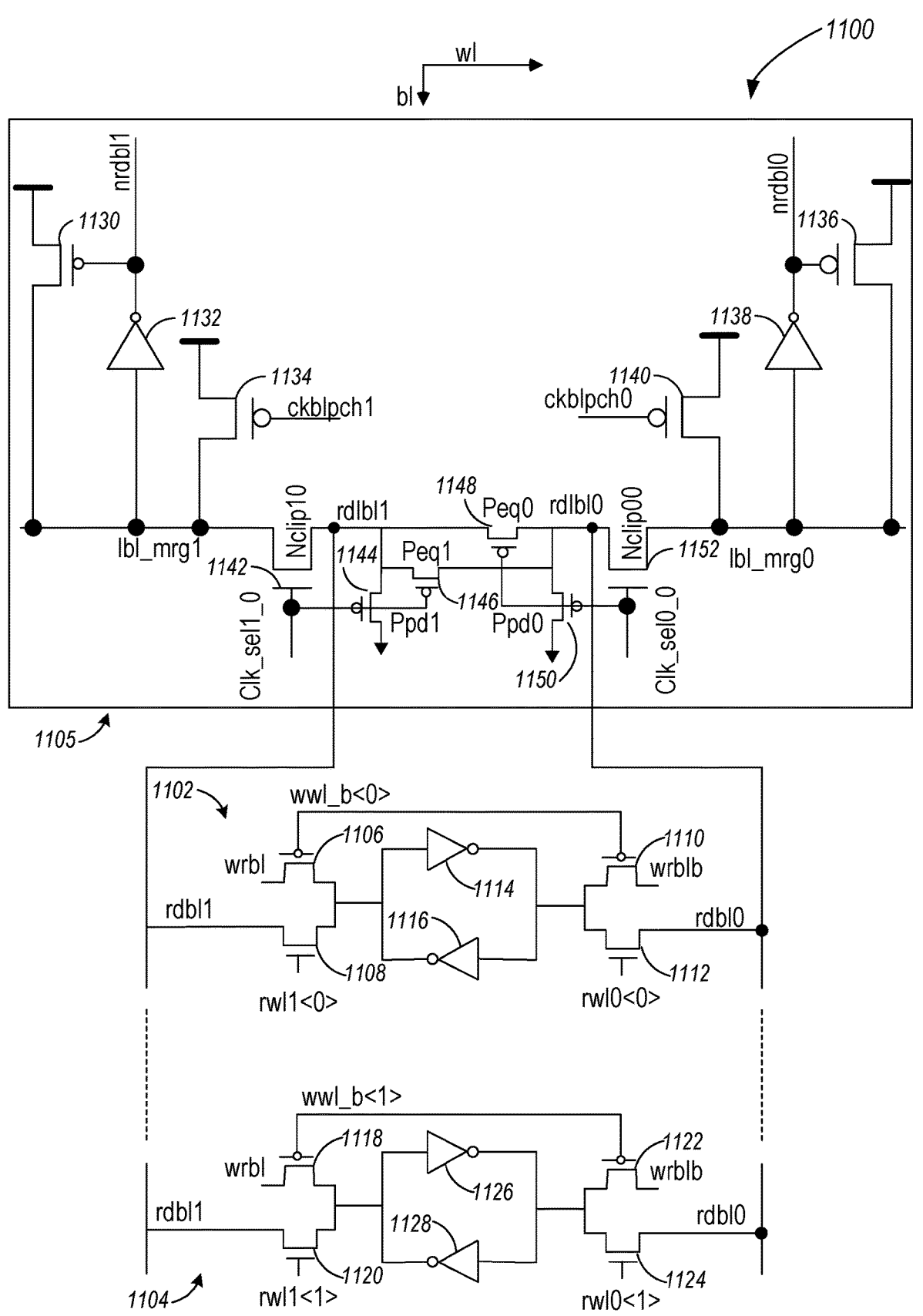
FIG. 11 illustrates cross-coupled and pull-down PMOS in a read merge circuit for area reduction, in accordance with some embodiments.

Example graphs of the signals discussed above in connection with the two phases of a read operation are illustrated in FIG. 10. FIG. 10 illustrates a graphical representation 1000 of signals used by the memory device of FIG. 9, in accordance with some embodiments;

FIG. 11 illustrates a memory device 1100 including cross-coupled and pull-down PMOS in a read merge circuit for area reduction, in accordance with some embodiments. Referring to FIG. 11, the memory device 1100 includes multiple bitcells 1102, . . . , 1104, and a read merge circuit 1105. Each of the bitcells 1102, . . . , 1104 can be a 2R1 W bitcell similar to bitcell 500 of FIG. 5. More specifically, bitcell 1102 includes PMOS transistors 1106 and 1110, NMOS transistors 1108 and 1112, and inverters 1114 and 1116, all coupled in a 2R1 W configuration. Similarly, bitcell 1104 includes PMOS transistors 1118 and 1122, NMOS transistors 1120 and 1124, and inverters 1126 and 1128, all coupled in a 2R1 W configuration.

The read merge circuit 1105 includes clipper devices 1142 and 1152, PMOS transistors 1144, 1146, 1148, and 1150, pre-charge devices 1134 and 1140, inverters 1132 and 1138, and keeper devices 1130 and 1136.

A lower-area variant of the read merge circuit of FIG. 9, which can be realized using a PMOS pull-down as shown in FIG. 11. The use of PMOS pull-down (Ppd0/Ppd1) enables a compact design since this reduces the required number of clippers enable signals (clk_selp0_0-3, clk_selp1_0-3) as well as inherent timing interlock between the pulldown (Ppd0/1) turning OFF and clipper (Nclip00/10) turning ON. However, PMOS pulldown takes a relatively long time to predischarge the bitline voltage from a previous read operation, slowing down the performance of the design. The use of PMOS pull-down also causes an offset between the pre-conditioned voltage levels of the read bitline of two ports, hence diminishing the bitcell stability during a read operation. To further reduce the offset between the read bitlines between two read ports, cross-coupled equalizer PMOS transistors (Peq0/1) are used. Due to the balanced distribution of P/N devices in the merge circuitry, the configuration of memory device 1100 can result in a smaller area compared to the earlier described approach in FIG. 9.

FIG. 12 illustrates a flow diagram of a method 1200 for performing a memory access operation, in accordance with some embodiments. Referring to FIG. 12, method 1200 includes operations 1202, 1204, and 1206, which may be executed by the circuitry of the memory device 116 (which can include one or more of the memory devices discussed in connection with FIGS. 5-11) or another processor of a computing device (e.g., hardware processor 1302 of device 1300 illustrated in FIG. 13).

In some aspects, the memory device (e.g., memory device 116 which can be the same as memory device 900) includes a plurality of bitcells (e.g., bitcells 902, . . . , 904) coupled via a local bitline (e.g., local bitline 911). Each bitcell of the plurality of bitcells includes at least two read ports (e.g., rdbl0 and rdbl1). The memory device further includes read merge circuitry 905 coupled to the local bitline 911.

At operation 1202, the read merge circuitry can be configured to pre-discharge a node of the local bitline at the first read port of the at least two read ports of the bitcell to a source supply voltage (Vss). Additionally, the lb1_merge node (e.g., node 941 of the read merge circuit 905 in FIG. 9) is pre-charged. At operation 1204, the read merge circuitry can be configured to initiate charge sharing between the node of the local bitline and a full swing local bitline node of the read merge circuitry. At operation 1206, the read merge circuitry can be configured to assert a read wordline (RWL) at a read transfer transistor of the bitcell to cause a read operation at the first read port.

The read merge circuitry further includes a first N-channel metal-oxide semiconductor (NMOS) transistor configured as a pre-discharge device (e.g., pre-discharge device 930). In some aspects, the pre-discharge device is configured to pre-discharge the node of the local bitline (e.g., node 945) based on a clock select high voltage signal (e.g., clkb_sel0 signal) asserted at a gate of the first NMOS transistor.

In some aspects, the read merge circuitry further includes a P-channel metal-oxide semiconductor (PMOS) transistor configured as a pre-charge device (e.g., pre-charge device 938). In some aspects, the pre-charge device is configured to charge the full swing local bitline node of the read merge circuitry (e.g., node 943 and node 941) before the charge sharing, based on a clock select low voltage signal (e.g., ckblpch signal) asserted at a gate of the PMOS transistor.

In some aspects, the read merge circuitry further includes a second NMOS transistor configured as a clipper device (e.g., clipper device 932). In some aspects, the clipper device is configured to initiate the charge sharing between the node of the local bitline (e.g., node 945) and the full swing local bitline node (e.g., node 943 or node 941) of the read merge circuitry based on a clock select high voltage signal (e.g., clk_sel0 signal) asserted at a gate of the second NMOS transistor.

Figure 13:
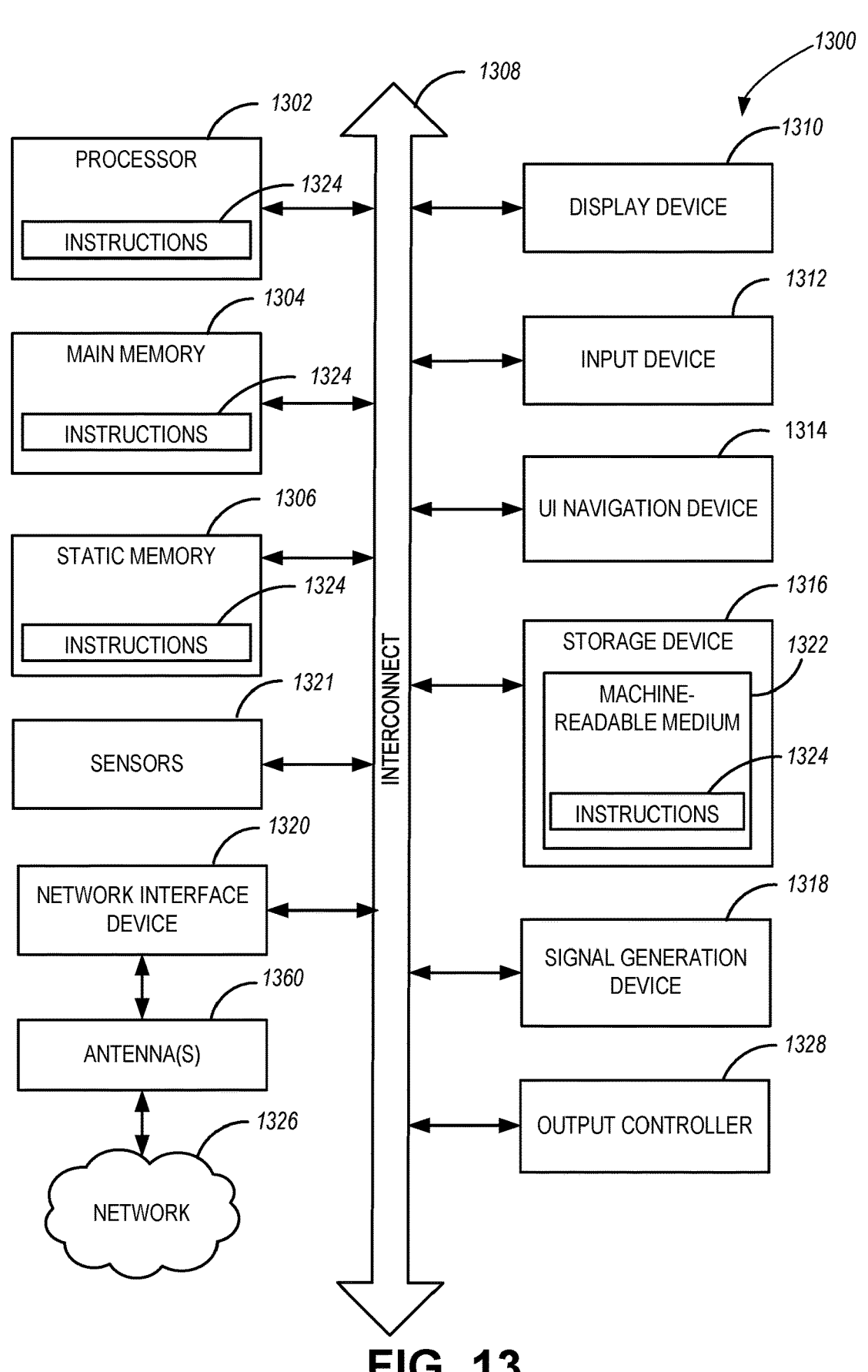
FIG. 13 illustrates a block diagram of an example machine upon which any one or more of the operations/techniques (e.g., methodologies) discussed herein may perform.

FIG. 13 illustrates a block diagram of an example machine 1300 upon which any one or more of the techniques (e.g., methodologies) discussed herein may perform. In alternative embodiments, the machine 1300 may operate as a standalone device or may be connected (e.g., networked) to other machines. In a networked deployment, machine 1300 may operate in the capacity of a server machine, a client machine, or both in server-client network environments. In an example, the machine 1300 may act as a peer machine in a peer-to-peer (P2P) (or other distributed) network environment. The machine 1300 may be a personal computer (PC), a tablet PC, a set-top box (STB), a personal digital assistant (PDA), a portable communications device, a mobile telephone, a smartphone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Machine (e.g., computer system) 1300 may include a hardware processor 1302 (e.g., a central processing unit (CPU), a graphics processing unit (GPU), a hardware processor core, or any combination thereof), a main memory 1304, and a static memory 1306, some or all of which may communicate with each other via an interlink (e.g., bus) 1308. In some aspects, the main memory 1304, the static memory 1306, or any other types of memory (including cache memory) used by the machine 1300 can be configured based on the disclosed techniques or can implement the disclosed memory devices.

Specific examples of main memory 1304 include Random Access Memory (RAM), and semiconductor memory devices, which may include, in some embodiments, storage locations in semiconductors such as registers. Specific examples of static memory 1306 include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; RAM; and CD-ROM and DVD-ROM disks.

Machine 1300 may further include a display device 1310, an input device 1312 (e.g., a keyboard), and a user interface (UI) navigation device 1314 (e.g., a mouse). In an example, the display device 1310, input device 1312, and UI navigation device 1314 may be a touch screen display. The machine 1300 may additionally include a storage device (e.g., drive unit or another mass storage device) 1316, a signal generation device 1318 (e.g., a speaker), a network interface device 1320, and one or more sensors 1321, such as a global positioning system (GPS) sensor, compass, accelerometer, or other sensors. The machine 1300 may include an output controller 1328, such as a serial (e.g., universal serial bus (USB), parallel, or other wired or wireless (e.g., infrared(IR), near field communication (NFC), etc.) connection to communicate or control one or more peripheral devices (e.g., a printer, card reader, etc.). In some embodiments, the processor 1302 and/or instructions 1324 may comprise processing circuitry and/or transceiver circuitry.

The storage device 1316 may include a machine-readable medium 1322 on which is stored one or more sets of data structures or instructions 1324 (e.g., software) embodying or utilized by any one or more of the techniques or functions described herein. The instructions 1324 may also reside, completely or at least partially, within the main memory 1304, within static memory 1306, or within the hardware processor 1302 during execution thereof by the machine 1300. In an example, one or any combination of the hardware processor 1302, the main memory 1304, the static memory 1306, or the storage device 1316 may constitute machine-readable media.

Specific examples of machine-readable media may include non-volatile memory, such as semiconductor memory devices (e.g., EPROM or EEPROM) and flash memory devices; magnetic disks, such as internal hard disks and removable disks; magneto-optical disks; RAM; and CD-ROM and DVD-ROM disks.

While the machine-readable medium 1322 is illustrated as a single medium, the term "machine-readable medium" may include a single medium or multiple media (e.g., a centralized or distributed database, and/or associated caches and servers) configured to store one or more instructions 1324.

An apparatus of the machine 1300 may be one or more of a hardware processor 1302 (e.g., a central processing unit (CPU), a graphics processing unit (GPU), a hardware processor core, or any combination thereof), a main memory 1304 and a static memory 1306, one or more sensors 1321, a network interface device 1320, antennas 1360, a display device 1310, an input device 1312, a UI navigation device 1314, a storage device 1316, instructions 1324, a signal generation device 1318, and an output controller 1328. The apparatus may be configured to perform one or more of the methods and/or operations disclosed herein. The apparatus may be intended as a component of the machine 1300 to perform one or more of the methods and/or operations disclosed herein, and/or to perform a portion of one or more of the methods and/or operations disclosed herein. In some embodiments, the apparatus may include a pin or other means to receive power. In some embodiments, the apparatus may include power conditioning hardware.

The term "machine-readable medium" may include any medium that is capable of storing, encoding, or carrying instructions for execution by the machine 1300 and that causes the machine 1300 to perform any one or more of the techniques of the present disclosure, or that is capable of storing, encoding or carrying data structures used by or associated with such instructions. Non-limiting machine-readable medium examples may include solid-state memories and optical and magnetic media. Specific examples of machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine-readable media may include non-transitory machine-readable media. In some examples, machine-readable media may include machine-readable media that is not a transitory propagating signal.

The instructions 1324 may further be transmitted or received over a communications network 1326 using a transmission medium via the network interface device 1320 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others.

In an example, the network interface device 1320 may include one or more physical jacks (e.g., Ethernet, coaxial, or phone jacks) or one or more antennas to connect to the communications network 1326. In an example, the network interface device 1320 may include one or more antennas 1360 to wirelessly communicate using at least one single-input multiple-output (SIMO), multiple-input multiple-output (MIMO), or multiple-input single-output (MISO) techniques. In some examples, the network interface device 1320 may wirelessly communicate using Multiple User MIMO techniques. The term "transmission medium" shall be taken to include any intangible medium that is capable of storing, encoding, or carrying instructions for execution by the machine 1300, and includes digital or analog communications signals or other intangible media to facilitate communication of such software.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or concerning external entities such as other circuits) in a specified manner as a module. In an example, the whole or part of one or more computer systems (e.g., a standalone, client, or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using the software, the general-purpose hardware processor may be configured as respective different modules at different times. The software may accordingly configure a hardware processor, for example, to constitute a particular module at one instance of time and to constitute a different module at a different instance of time.

Some embodiments may be implemented fully or partially in software and/or firmware. This software and/or firmware may take the form of instructions contained in or on a non-transitory computer-readable storage medium. Those instructions may then be read and executed by one or more processors to enable the performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read-only memory (ROM); random access memory (RAM); magnetic disk storage media; optical storage media; flash memory, etc.

The above-detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof) or with respect to other examples (or one or more aspects thereof) shown or described herein.

Publications, patents, and patent documents referred to in this document are incorporated by reference herein in their entirety, as though individually incorporated by reference. In the event of inconsistent usage between this document and those documents so incorporated by reference, the usage in the incorporated reference(s) is supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels and are not intended to suggest a numerical order for their objects.

The embodiments as described above may be implemented in various hardware configurations that may include a processor for executing instructions that perform the techniques described. Such instructions may be contained in a machine-readable medium such as a suitable storage medium or a memory or other processor-executable medium.

The embodiments as described herein may be implemented in a number of environments such as part of a wireless local area network (WLAN), 3rd Generation Partnership Project (3GPP) Universal Terrestrial Radio Access Network (UTRAN), or Long-Term-Evolution (LTE) or a Long-Term-Evolution (LTE) communication system, although the scope of the disclosure is not limited in this respect.

Antennas referred to herein may comprise one or more directional or omnidirectional antennas, including, for example, dipole antennas, monopole antennas, patch antennas, loop antennas, and microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, antennas may be effectively separated to take advantage of spatial diversity and the different channel characteristics that may result between each antenna and the antennas of a transmitting station. In some MIMO embodiments, antennas may be separated by up to $1/10$ of a wavelength or more.

Described implementations of the subject matter can include one or more features, alone or in combination as illustrated below by way of examples.

Example 1 is a memory device comprising: at least one bitcell coupled to a local bitline, the at least one bitcell comprising: a first set of a plurality of transistor devices configured to form at least one write port, the at least one write port to receive digital data; a second set of the plurality of transistor devices configured as an inverter pair, the inverter pair to store the digital data; and a third set of the plurality of transistor devices configured to form at least one read port, the at least one read port to access the digital data stored at the inverter pair and output the digital data on the local bitline, and the plurality of transistor devices consisting of an equal number of P-channel transistor devices and N-channel transistor devices.

In Example 2, the subject matter of Example 1 includes subject matter where the plurality of transistor devices consists of four N-channel metal-oxide semiconductor (NMOS) transistor and four P-channel metal-oxide semiconductor (PMOS) transistors.

In Example 3, the subject matter of Example 2 includes subject matter where the at least one write port is a single write (1 W) port formed by two of the four PMOS transistors.

In Example 4, the subject matter of Example 3 includes, R) ports formed by two of the four NMOS transistors.

In Example 5, the subject matter of Examples 1-4 includes subject matter where the P-channel transistor devices and the N-channel transistor devices comprise complementary field-effect transistors (CFETs).

In Example 6, the subject matter of Examples 1-5 includes, the at least one read port configured for a differential read of the digital data stored in the inverter pair.

In Example 7, the subject matter of Examples 1-6 includes subject matter where the at least one write port is formed by two of the P-channel transistor devices.

In Example 8, the subject matter of Example 7 includes subject matter where gate terminals of the two of the P-channel transistor devices form a write-wordline-bar (wwl_b) terminal associated with writing the digital data into the inverter pair.

In Example 9, the subject matter of Examples 1-8 includes subject matter where the at least one bitcell is configured as one of the following: an eight-transistor (8T) two read port and one write port (2R1 W) bitcell; an 8T one read port and one write port (1R1 W) bitcell, wherein the one read port is configured for a single-ended read operation; and an 8T 1R1 W bitcell, wherein the one read port is configured for a differential read operation.

Example 10 is a memory device comprising: a plurality of bitcells coupled via a local bitline, each bitcell of the plurality of bitcells comprising at least two read ports; and read merge circuitry coupled to the local bitline, the read merge circuitry to: pre-discharge a node of the local bitline at a first read port of the at least two read ports of the bitcell to a source supply voltage (Vss); initiate charge sharing between the node of the local bitline and a full swing local bitline node of the read merge circuitry; and assert a read wordline (RWL) at a read transfer transistor of the bitcell to cause a read operation at the first read port.

In Example 11, the subject matter of Example 10 includes subject matter where the read merge circuitry further comprises: a first N-channel metal-oxide semiconductor (NMOS) transistor configured as a pre-discharge device.

In Example 12, the subject matter of Example 11 includes subject matter where the pre-discharge device is configured to pre-discharge the node of the local bitline based on a clock select high voltage signal asserted at a gate of the first NMOS transistor.

In Example 13, the subject matter of Examples 11-12 includes subject matter where the read merge circuitry further comprises: a P-channel metal-oxide semiconductor (PMOS) transistor configured as a pre-charge device.

In Example 14, the subject matter of Example 13 includes subject matter where the pre-charge device is configured to charge the full swing local bitline node of the read merge circuitry before the charge sharing, based on a clock select low voltage signal asserted at a gate of the PMOS transistor.

In Example 15, the subject matter of Examples 13-14 includes subject matter where the read merge circuitry further comprises: a second NMOS transistor configured as a clipper device.

In Example 16, the subject matter of Example 15 includes subject matter where the clipper device is configured to initiate the charge sharing between the node of the local bitline and the full swing local bitline node of the read merge circuitry based on a clock select high voltage signal asserted at a gate of the second NMOS transistor.

Example 17 is a method for performing a memory access operation, the method comprising: pre-discharging a node of a local bitline at a first read port of at least two read ports of a bitcell to a source supply voltage (Vss); initiating a charge sharing between a node of the local bitline and a full swing local bitline node of a read merge circuitry coupled to the local bitline; and asserting a read wordline (RWL) at a read transfer transistor of the bitcell to cause a read operation at the first read port.

In Example 18, the subject matter of Example 17 includes, asserting a first clock select high voltage signal at a gate of a first N-channel metal-oxide semiconductor (NMOS) transistor of the read merge circuitry to perform the pre-discharging of the node of the local bitline.

In Example 19, the subject matter of Example 18 includes, asserting a clock select low voltage signal at a gate of a P-channel metal-oxide semiconductor (PMOS) transistor of the read merge circuitry to charge the full swing local bitline node of the read merge circuitry before the charge sharing.

In Example 20, the subject matter of Example 19 includes, asserting a second clock select high voltage signal at a gate of a second NMOS transistor of the read merge circuitry to initiate the charge sharing between the node of the local bitline and the full swing local bitline node of the read merge circuitry.

Example 21 is at least one machine-readable medium including instructions that, when executed by processing circuitry, cause the processing circuitry to perform operations to implement any of Examples 1-20.

Example 22 is an apparatus comprising means to implement any of Examples 1-20.

Example 23 is a system to implement any of Examples 1-20.

Example 24 is a method to implement any of Examples 1-20.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments dis-closed herein is to be determined regarding the appended claims, along with the full scope of equivalents to which such claims are entitled.

What is claimed is:

1. A memory device comprising:
at least one bitcell coupled to a local bitline, the local bitline comprising a plurality of pre-discharge devices, and the at least one bitcell comprising:
a first set of a plurality of transistor devices configured to form at least one write port, the at least one write port to receive digital data;
a second set of the plurality of transistor devices configured as an inverter pair, the inverter pair to store the digital data;
a third set of the plurality of transistor devices config-ured to form at least one read port, the at least one read port to access the digital data stored at the inverter pair and output the digital data to a node on the local bitline, and the plurality of transistor devices consisting of an equal number of P-channel transistor devices and N-channel transistor devices, wherein the first set and the third set comprise transistor devices of a different type, at least one of the first set or the third set comprises transistor devices with a common gate terminal, and at least one of the plurality of pre-discharge devices pre-discharges the node to a source supply voltage (Vss); and
read merge circuitry coupled to the local bitline, the read merge circuitry comprising a plurality of pre-discharge devices coupled to a corresponding plu-rality of clipper devices, and the read merge circuitry to:
pre-discharge a node of the local bitline at a first read port of the at least one read port of the bitcell to a source supply voltage (Vss) at a first pre-discharge device of the plurality of pre-discharge devices;
initiate charge sharing between the node of the local bitline and a full swing local bitline node of the read merge circuitry via a first clipper device of the plurality of clipper devices; and
assert a read wordline (RWL) at a read transfer transistor of the bitcell to cause a read operation at the first read port.

2. The memory device of claim 1, wherein the plurality of transistor devices consists of four N-channel metal-oxide semiconductor (NMOS) transistors and four P-channel metal-oxide semiconductor (PMOS) transistors.

3. The memory device of claim 2, wherein the at least one write port is a single write (1 W) port formed by two PMOS transistors of the four PMOS transistors, the two PMOS transistors having the common gate terminal.

4. The memory device of claim 3, wherein the at least one read port comprises two read (2R) ports formed by two of the four NMOS transistors.

5. The memory device of claim 1, wherein the P-channel transistor devices and the N-channel transistor devices com-prise complementary field-effect transistors (CFETs).

6. The memory device of claim 1, wherein the at least one read port is a single read (1R) port formed by at least two of the N-channel transistor devices, the at least one read port configured for a differential read of the digital data stored in the inverter pair.

7. The memory device of claim 1, wherein the at least one write port is formed by two of the P-channel transistor devices.

8. The memory device of claim 7, wherein gate terminals of the two of the P-channel transistor devices form a write-wordline-bar (wwl_b) terminal associated with writing the digital data into the inverter pair.

9. The memory device of claim 1, wherein the at least one bitcell is configured as one of:

an eight-transistor (8T) two read port and one write port (2R1W) bitcell;

an 8T one read port and one write port (1R1W) bitcell, wherein the one read port is configured for a single-ended read operation; and an 8T 1R1W bitcell, wherein the one read port is configured for a differential read operation.

10. A memory device comprising:

a plurality of bitcells coupled via a local bitline, each bitcell of the plurality of bitcells comprising at least two read ports; and read merge circuitry coupled to the local bitline, the read merge circuitry comprising a plurality of pre-discharge devices coupled to a corresponding plurality of clipper devices, and the read merge circuitry to:

pre-discharge a node of the local bitline at a first read port of the at least two read ports of the bitcell to a source supply voltage (Vss) at a first pre-discharge device of the plurality of pre-discharge devices;

initiate charge sharing between the node of the local bitline and a full swing local bitline node of the read merge circuitry via a first clipper device of the plurality of clipper devices; and assert a read wordline (RWL) at a read transfer transistor of the bitcell to cause a read operation at the first read port.

11. The memory device of claim 10, wherein the read merge circuitry further comprises:

a first N-channel metal-oxide semiconductor (NMOS) transistor configured as the first pre-discharge device.

12. The memory device of claim 11, wherein the first pre-discharge device is configured to pre-discharge the node of the local bitline based on a clock select high voltage signal asserted at a gate of the first NMOS transistor.

13. The memory device of claim 11, wherein the read merge circuitry further comprises:

a P-channel metal-oxide semiconductor (PMOS) transistor configured as a pre-charge device.

14. The memory device of claim 13, wherein the pre-charge device is configured to charge the full swing local bitline node of the read merge circuitry before the charge sharing, based on a clock select low voltage signal asserted at a gate of the PMOS transistor.

15. The memory device of claim 13, wherein the read merge circuitry further comprises:

a second NMOS transistor configured as the first clipper device.

16. The memory device of claim 15, wherein the first clipper device is configured to initiate the charge sharing between the node of the local bitline and the full swing local bitline node of the read merge circuitry based on a clock select high voltage signal asserted at a gate of the second NMOS transistor.

17. A method for performing a memory access operation, the method comprising:

pre-discharging at a pre-discharge device of a plurality of pre-discharge devices coupled to a corresponding plurality of clipper devices, a node of a local bitline at a first read port of at least two read ports of a bitcell to a source supply voltage (Vss);

initiating a charge sharing between a node of the local bitline and a full swing local bitline node of a read merge circuitry coupled to the local bitline; and asserting a read wordline (RWL) at a read transfer transistor of the bitcell to cause a read operation at the first read port.

18. The method of claim 17, further comprising:

asserting a first clock select high voltage signal at a gate of a first N-channel metal-oxide semiconductor (NMOS) transistor of the read merge circuitry to perform the pre-discharging of the node of the local bitline.

19. The method of claim 18, further comprising:

assert a clock select low voltage signal at a gate of a P-channel metal-oxide semiconductor (PMOS) transistor of the read merge circuitry to charge the full swing local bitline node of the read merge circuitry before the charge sharing.

20. The method of claim 19, further comprising:

asserting a second clock select high voltage signal at a gate of a second NMOS transistor of the read merge circuitry to initiate the charge sharing between the node of the local bitline and the full swing local bitline node of the read merge circuitry.

* * * * *